United States Patent
Noro et al.

(12)

(10) Patent No.: US 6,724,333 B1
(45) Date of Patent: Apr. 20, 2004

(54) DIGITAL-TO-ANALOG CONVERTER

(75) Inventors: Masao Noro, Hamamatsu (JP);
Akihiko Toda, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 10/148,300

(22) PCT Filed: Nov. 22, 2000

(86) PCT No.: PCT/JP00/08248

§ 371 (c)(1),
(2), (4) Date: Feb. 20, 2003

(87) PCT Pub. No.: WO01/41310

PCT Pub. Date: Jun. 7, 2001

(30) Foreign Application Priority Data

Nov. 30, 1999 (JP) .......................................... 11/341481

(51) Int. Cl.[7] ................................................. H03M 1/66
(52) U.S. Cl. ....................................... 341/144; 341/154
(58) Field of Search ................................ 341/144, 145, 341/120, 154

(56) References Cited

U.S. PATENT DOCUMENTS

| | | | | |
|---|---|---|---|---|
| 4,491,825 A | * | 1/1985 | Tuthill | 341/145 |
| 5,283,579 A | | 2/1994 | Tasdighi et al. | |
| 5,729,231 A | * | 3/1998 | Kikuchi | 341/144 |
| 5,742,245 A | | 4/1998 | Noro | |
| 5,841,382 A | * | 11/1998 | Walden et al. | 341/120 |
| 6,246,351 B1 | * | 6/2001 | Yilmaz | 341/145 |

FOREIGN PATENT DOCUMENTS

| | | |
|---|---|---|
| EP | 0281116 | 3/1988 |
| EP | 0605883 | 12/1993 |

* cited by examiner

*Primary Examiner*—Jean Jeanglaude
(74) *Attorney, Agent, or Firm*—Pillsbury Winthrop LLP

(57) ABSTRACT

There is provided a D/A converter that is free from a variation in the voltage width of 1 LSB between more significant bits and less significant bits of data for conversion due to variations in characteristics of resistors, transistors, etc. to thereby ensure a higher conversion accuracy than the conventional D/A converter. The eight more significant bits of 12-bit data for conversion are applied to a decoder 21, while the four less significant bits of the same are applied to a current addition circuit 22. The decoder 21 selects one of FET's F0 to F255 based on the eight more significant bits to cause one of voltages divided by a series circuit formed by resistors r0 to r255 to be applied to an operational amplifier 40. On the other hand, switches 30 to 33 of the current addition circuit 22 are switched, respectively, by the four less significant bits to turn respective FET's 35 to 38 on and off. As a result, currents flowing through turned-on ones of the FET's 35 to 38 are synthesized to flow through the resistor ra so that a voltage is generated across the resistor ra. The operational amplifier 40 synthesizes the two voltages and then outputs the synthesized voltage. An FET 24 and each of the FET's 35 to 38 form a current mirror circuit, whereby the influence of variations in characteristics of the resistors, etc. is eliminated.

3 Claims, 3 Drawing Sheets

US 6,724,333 B1

DIGITAL-TO-ANALOG CONVERTER

This application is the National Phase of International Application PCT/JP00/08248 filed Nov. 22, 2000 which designated the U.S.

TECHNICAL FIELD

This invention relates to a resistor string digital-to-analog (hereinafter referred to "D/A") converter.

BACKGROUND ART

In resistor string D/A converters, resistors having the same resistance value with each other are connected in series, and voltages at respective junctions between the resistors are selectively output as an analog voltage corresponding to data for conversion. Accordingly, to convert data having an increased number of bits, the D/A converter is required to have a correspondingly increased number of resistors. This is very undesirable, particularly when a D/A converter of this type is formed within a small chip area of a semiconductor integrated circuit, since a large area of the chip is occupied by the resistors of the converter, and depending on the number of data bits, it is impossible to form the D/A converter. To solve this problem by reducing the number of resistors, it has been employed to generate a voltage corresponding to less significant bits of data for conversion by a current addition method.

FIG. 3 is a circuit diagram showing the whole arrangement of a D/A converter of this type. In the figure, symbol DI designates an input terminal through which is supplied 8-bit data for conversion. The six more significant bits (second to seventh bits) of the data supplied through the input terminal DI are applied to a decoder 1, while the two less significant bits (first and zeroth bits) are applied to a current addition circuit 2. Reference numerals r0 to r63 designate resistors connected in series and having the same resistance value (R2) with each other. Reference numeral 3 designates an operational amplifier. The operational amplifier 3 has a non-inverting input thereof supplied with a constant voltage Vref, an inverting input thereof connected to a midpoint C of the resistors r0 to r63, and an output thereof connected to one end of the resistor r63. The resistor r0 has one end thereof grounded via a resistor rx. Reference numerals F0 to F63 designate FET's each of which serves as an analog switch and is turned on and off by an output from the decoder 1.

In the current addition circuit 2, reference numeral 5 designates a terminal to which a reference voltage V1 is applied, reference numeral 6 a resistor, and reference numerals 7 to 11 FET's. A series circuit formed by the resistor 6 and the FET 7 and a series circuit by the FET's 8, 9 form a current mirror circuit, and the series circuit formed by the resistor 6 and the FET 7 and a series circuit by the FET's 10, 11 form another current mirror circuit. Therefore, currents i1, i0 flowing, respectively, through the circuit formed by the FET's 8, 9 and the circuit formed by the FET's 10, 11 each have a value which is proportional to that of a current ir flowing through the circuit formed by the resistor 6 and the FET 7. The FET's 8, 10 are turned on and off, respectively, by the first bit and the zeroth bit (LSB) of the data for conversion. Reference numeral 14 designates an operational amplifier. The operational amplifier 14 has a non-inverting input thereof connected to a voltage at a common junction of the FET's 0 to 63, an inverting input thereof connected to a common junction of the FET's 8, 10, and an output thereof connected to an analog output terminal DO of the D/A converter. Further, a feedback resistor ra (resistance value R1) is inserted between the output of the operational amplifier 14 and the inverting input of the same.

In the D/A converter constructed as above, a voltage at the midpoint C of the resistors r0 to r63 is equal to the constant voltage Vref. Accordingly, a constant current i determined by the constant voltage Vref flows through the resistors r0 to r63. Consequently, a voltage drop across each of the resistors r0 to r63 is expressed as follows:

$$i \times R2$$

On the other hand, the gate width of the FET 11 is adjusted in advance such that the current i0 which flows through the FET 11 when the FET 10 is in the ON state satisfies the relationship expressed by the following equation:

$$i0 \times R1 = i \times R2/4$$

Similarly, the gate width of the FET 9 is adjusted in advance such that the current i1 which flows through the FET 9 when the FET 8 is in the ON state satisfies the relationship expressed by the following equation:

$$i1 \times R1 = i \times R2/4$$

As a result, a current corresponding to the two less significant bits of the data for conversion flows through the resistor ra, whereby a voltage corresponding to the two less significant bits is developed across the resistor ra. On the other hand, the six more significant bits of the data for conversion are decoded by the decoder 1, and one of the FET's F0 to F63 is turned on by the decoded output from the decoder 1, whereby a voltage at one of the junctions between the resisters r0 to r63 which corresponds to the FET that is turned on is supplied to the non-inverting input of the operational amplifier 14. The operational amplifier 14 adds the voltage supplied to its non-inverting input and the voltage drop across the resistor ra, and then outputs the result of the addition via the output terminal DO as an analog voltage corresponding to the data for conversion.

In the above conventional D/A converter, since the current i which flows through the resistors r0 to r63 and the current ir which flows through the circuit formed by the resistor 6 and the FET 7 are determined by the respective different circuits, the voltage width of 1 LSB differs between the six more significant bits and the two less significant bits due to variations in characteristics of the resistors, transistors, etc. caused by the manufacturing process. For instance, a variation in the current ir due to a variation in the threshold value Vt of the FET 7 causes a change in the voltage width of 1 LSB of the two less significant bits. Consequently, the conventional D/A converter suffers from lowered conversion accuracy, particularly when the number of data bits is large.

The present invention has been devised to eliminate the above stated inconvenience, and it is an object of the invention to provide a D/A converter that is free from a variation in the voltage width of 1 LSB between the more significant bits and the less significant bit due to variations in characteristics of resistors, transistors, etc. to thereby ensure higher conversion accuracy than the conventional D/A converter.

DISCLOSURE OF INVENTION

To attain the above object, the invention provides a digital-to-analog converter comprising a plurality of resistors connected in series, selection means that selects one of voltages at respective junctions between the plurality of resistors, based on M (M: an integer which is larger than 1) more significant bits of data for conversion, current output means that generates a current having a value which is proportional to a value of a current flowing through the plurality of resistors and corresponds to N (N: an integer which is larger than 1) less significant bits of the data for conversion, a conversion resistor that converts an output current from the current output means to a voltage, and an operational circuit that performs an operation on the voltage selected by the selection means and a voltage developed across the conversion resistor, wherein the current output means comprises a control transistor serially connected to the plurality of resistors connected in series, for controlling the current flowing through the plurality of resistors, and first to N-th transistors each controlled by a voltage identical to a voltage at a control terminal of the control transistor and each cooperating with the control transistor to form a current mirror circuit for outputting a current having a value which is proportional to a weight assigned to a corresponding one of the N less significant bits of the data for conversion, each of the first to N-th transistors being turned on and off by a corresponding one of the N less significant bits.

Further according to the invention, the digital-to-analog converter is characterized in that the selection means comprises a decoder that decodes the M more significant bits of the data for conversion, and a plurality of switch means each of which selects a corresponding one of voltage values at the respective junctions between the plurality of resistors, based on an output from the decoder.

Further according to the invention, the digital-to-analog converter, is characterized in that the operational circuit has a first input to which an output from the selection means is applied, a second input to which an output from the current output means is applied, and a feedback loop into which the conversion resistor is inserted.

BEST MODE OF CARRYING OUT THE INVENTION

Figure 1:
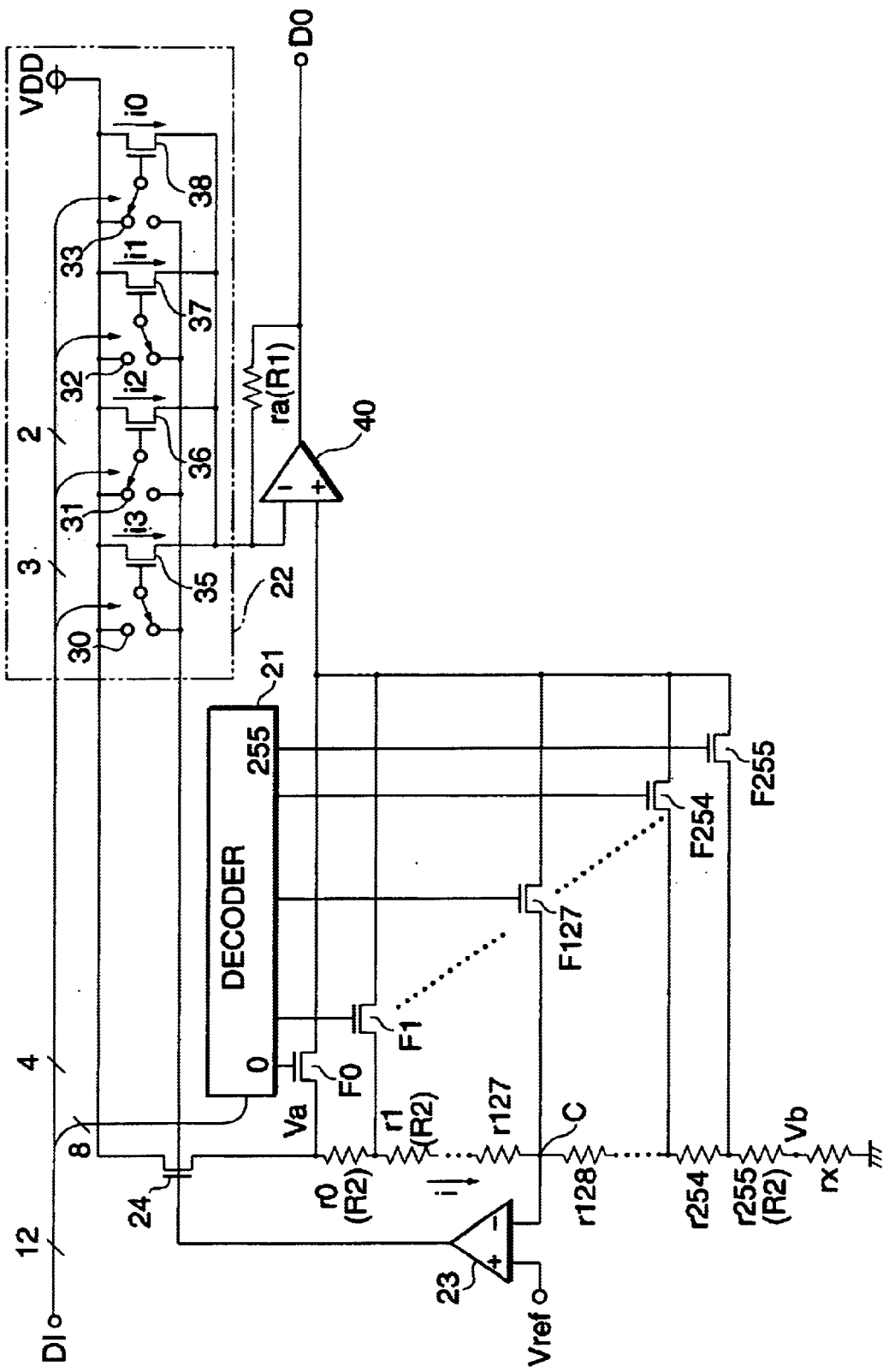
FIG. 1 is a block diagram showing the whole arrangement of a digital-to-analog converter according to an embodiment of the present invention.

The present invention will now be described in detail with reference to drawings showing an embodiment thereof. FIG. 1 shows the whole arrangement of a D/A converter according to an embodiment of the present invention. In the figure, symbol DI designates an input terminal of the D/A converter through which 12-bit data for conversion is supplied. The eight more significant bits (i.e. the fourth to eleventh bits) of the data supplied through the input terminal DI are applied to a decoder 21, while the four less significant bits (i.e. the zeroth to third bits) of the same are applied to a current addition circuit 22. Reference numerals r0 to r255 designate a plurality of resistors connected in series and having the same resistance value (R2) with each other. Reference numeral 23 designates an operational amplifier. The operational amplifier 23 has a non-inverting input thereof supplied with a constant voltage Vref, an inverting input thereof connected to a midpoint C of the serially-connected resistors r0 to r255, and an output thereof connected to the gate of an FET 24. The FET 24 controls a current flowing through the resistors r0 to r255 and has a source thereof connected to a positive power source VDD and a drain thereof connected to one end of the resistor r0. The resistor r255 has one end thereof grounded via a resistor rx.

Reference numerals F0 to F255 designate a plurality of FET's each of which serves as an analog switch and is turned on and off by an output from the decoder 21.

Further, in the current addition circuit 22, reference numerals 30 to 33 designate semiconductor switches, and reference numerals 35 to 38 FET's. The switches 30 to 33 each have a first contact thereof connected to the positive power source VDD, a second contact thereof connected to the output of the operational amplifier 23, and a common terminal thereof connected to the gate of a corresponding one of the FET 35 to 38. The FET's 35 to 38 each have a source thereof connected to the positive power source VDD, and the drains of the respective FET's 35 to 38 are commonly connected to an inverting input of an operational amplifier 40.

The switches 30 to 33 are switched by the respective third to zeroth bits of the data for conversion. More specifically, the common terminal of each of the switches 30 to 33 is connected to the first contact thereof when a corresponding one of the third to zeroth bits is "0", and connected to the second contact thereof when the corresponding bit is "1". The FET's 35 to 38 are each turned off when its gate is connected to the positive power source VDD via a corresponding one of the switches 30 to 33, whereas it cooperates with the FET 24 to form a current mirror circuit when its gate is connected to the output of the operational amplifier 23 (i.e. the gate of the FET 24) via the corresponding switch. More specifically, when the gate of each of the FET's 35 to 38 is connected to the gate of the FET 24, a current having a value proportional to that of the current i flowing through the resistors r0 to r255 flows through the FET.

The operational amplifier 40 has a non-inverting input connected to a common junction of the FET F0 to F255, and an output thereof connected to an analog output terminal DO. Further, a feedback resistor ra (resistance value R1) is inserted between the output of the operational amplifier 40 and the non-inverting input of the same.

In the D/A converter constructed as above, a voltage at the midpoint C of the resistors r0 to r255 is equal to the constant voltage Vref. Accordingly, a constant current i determined by the constant voltage Vref flows through the resistors r0 to r255. Consequently, a voltage drop across each of the resistors r0 to r255 is expressed as follows:

$i \times R2$

On the other hand, the FET 35 has a gate width thereof adjusted in advance such that a current i3 flowing through the FET 35 when the gate thereof is connected to the gate of the FET 24 satisfies the relationship expressed by the following equation:

$i3 \times R1 = 8 \times (i \times R2/16)$

Similarly, the FET's 36, 37, 38 each have a gate width thereof adjusted in advance such that a current i2, i1, or i0 flowing through the FET when the gate thereof is connected to the gate of the FET 24 satisfies the relationship expressed by a corresponding one of the following equations:

$i2 \times R1 = 4 \times (i \times R2/16)$ $$i1 \times R1 = 2 \times (i \times R2/16)$$

$$i0 \times R1 = 1 \times (i \times R2/16)$$

As a result, a current corresponding to the respective four less significant bits of the data for conversion flows through the resistor ra, whereby a voltage corresponding to the four less significant bits is developed across the resistor ra. For instance, when the four less significant bits are "1010" (10), the common terminals of the switches 30 and 32 are connected to the respective corresponding second contacts, whereby the following currents flow through the respective FET's 35, 37:

$$i3 = 8 \times (i \times R2/16)/R1$$

$$i1 = 2 \times (i \times R2/16)/R1$$

As a result, a voltage expressed by the following equation is developed across the resistor ra:

$$(i3+i1)R1 = 10 \times (i \times R2/16) \quad (1)$$

This means that a voltage which is (10/16) times as high as a voltage developed across one of the resistors r0 to r255 is generated across the resistor ra. As described above, in the FIG. 1 D/A converter, a voltage corresponding to a data set formed of the four less significant bits of the data for conversion is developed across the resistor ra.

On the other hand, the eight more significant bits of the data for conversion are decoded by the decoder 21, and one of the FET's F0 to F255 is turned on, based on the result of the decoding, whereby a voltage at a junction between the resisters to which the FET is connected is supplied to the non-inverting input of the operational amplifier 40.

For instance, when the eight more significant bits of the data for conversion is "00000100" (4), the FET F4 is turned on, whereby a voltage at the junction between the resistors r3 and r4 is output to the operational amplifier 40. Now, if a voltage at the junction between the drain of the FET 24 and the resistor r0 is represented by Va, and a voltage at the junction between the resistor r255 and the resistor rx by Vb, the voltage V4 at the junction between the resistors r3 and r4 can be expressed as follows:

$$V4 = Va - 4 \times R2 \times (Va - Vb)/256 \times R2 \quad (2)$$
$$= Va - 4 \times i \times R2$$

Further, assuming that the four less significant bits of the data for conversion are "0000", if the eight more significant bits alone are changed sequentially from 0 to 1, 2, 3, . . . (decimal representation), voltages output to the operational amplifier 40 are expressed respectively as follows:

$$0 \rightarrow Va$$

$$1 \rightarrow Va - i \times R2$$

$$2 \rightarrow Va - 2i \times R2$$

$$3 \rightarrow Va - 3i \times R2$$

When the four less significant bits are "0000", the voltages obtained as above are sequentially output from the operational amplifier 40 without being changed. More specifically, as the eight more significant bits are changed sequentially from "0", an output voltage from the output terminal DO changes as shown by a broken line L1 in FIG. 2.

The voltage corresponding to the four less significant bits (i.e. the voltage developed across the resistor ra) is subtracted from the voltage corresponding to the eight more significant bits by the operational amplifier 40, whereby a voltage corresponding to the data for conversion is obtained and output to the output terminal DO. For instance, when the data for conversion is "000001001010", the following output voltage is obtained from the aforegiven equations (1) and (2):

$$Va - 4 \times i \times R2 - 10 \times (i \times R2/16)$$

Figure 2:
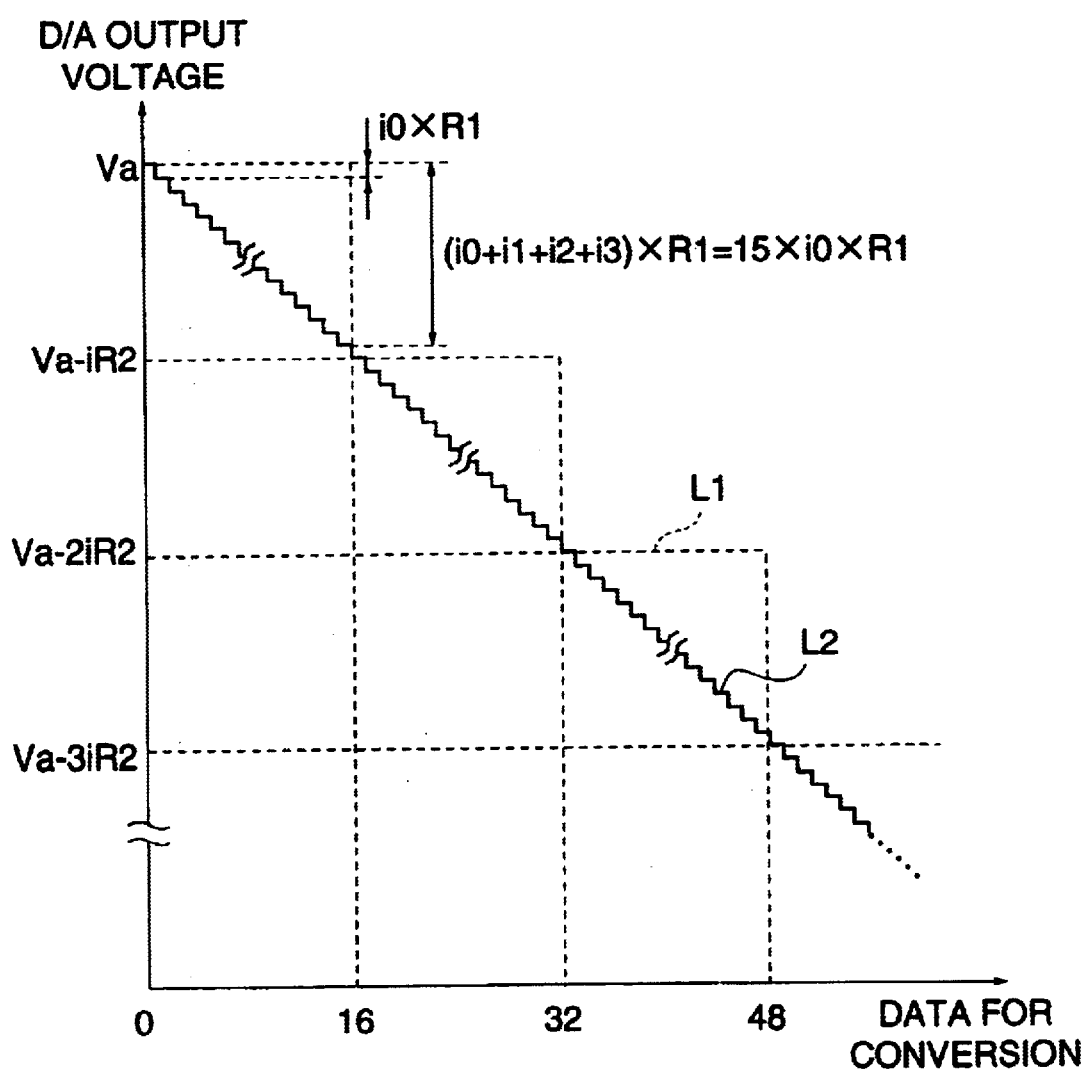
FIG. 2 is a diagram showing output characteristics of the digital-to-analog converter according to the embodiment, which is useful in explaining operations of the same.
Figure 3:
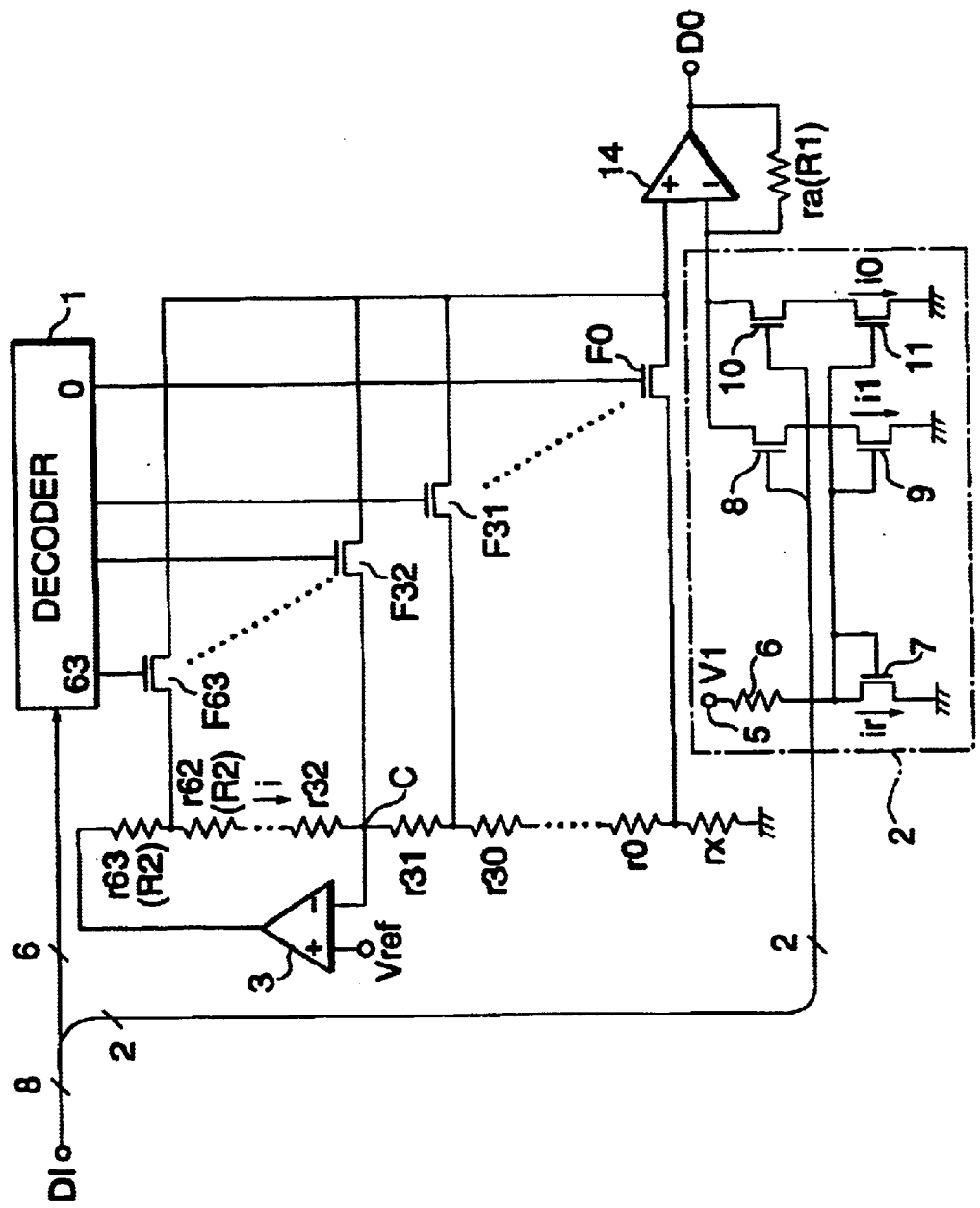
FIG. 3 is a block diagram showing the whole arrangement of a conventional digital-to-analog converter.

A stepped solid line L2 in FIG. 2 indicates the relationship between the data for conversion and the output voltage obtained by the conversion. As shown in the figure, the minimum voltage width of the voltage obtained by the conversion is i0×R1. Further, when the four less significant bits of the data for conversion are "1111", a voltage corresponding to the four less significant bits is expressed as follows:

$$(i0+i1+i2+i3) \times R1 = 15 \times i0 \times R1$$

As described above, according to the present embodiment, the eight more significant bits are converted to an analog voltage by the resistor string, and the four less significant bits are converted to an analog voltage by the current addition, and then the two analog voltages are synthesized into the converted voltage. In the present embodiment, the currents i3 to i0 flowing through the respective FET's 35 to 38 and the current i flowing through the series circuit of the resistors r0 to r255 are in a completely proportional relationship. Consequently, even if the current i has changed e.g. due to variations in the manufacturing process, the voltage width of 1 LSB does not change either in the eight more significant bits or in the four less significant bits, which makes it possible to perform highly accurate D/A conversion without being affected by the variations in the manufacturing process.

It should be noted that in the process of forming an integrated circuit, the resistors r0 to r255 and the resistor ra are required to be made of an identical material (having the same impurity concentration) and laid out such that each of them has an identical width. Further, the gate width of the FET 24 and those of the FET's 35 to 37 should be set with reference to the gate width of the FET 38 which has the minimum current flow therethrough.

Industrial Applicability

According to the present invention, a D/A converter is provided which includes a plurality of resistors connected in series, selection means that selects one of voltages at respective junctions between the plurality of resistors, based on M (M: an integer which is larger than 1) more significant bits of data for conversion, current output means that generates a current having a value which is proportional to that of a current flowing through the plurality of resistors and corresponds to N (N: an integer which is larger than 1) less significant bits of the data for conversion, a conversion resistor that converts an output current from the current output means to a voltage, and an operational circuit that performs an operation on the voltage selected by the selection means and a voltage developed across the conversion resistor. As a result, it is possible to prevent the voltage width of 1 LSB from differing between the more significant bits and the less significant bits due to variations in characteristics of the resistors, transistors, etc., and hence the present invention can provide a D/A converter having a higher conversion accuracy than the conventional D/A converter.

What is claimed is:

1. A digital-to-analog converter comprising:

a plurality of resistors connected in series;

selection means that selects one of voltages at respective junctions between said plurality of resistors, based on M (M: an integer which is larger than 1) more significant bits of data for conversion;

current output means that generates a current having a value which is proportional to a value of a current flowing through said plurality of resistors and corresponds to N (N: an integer which is larger than 1) less significant bits of said data for conversion;

a conversion resistor that converts an output current from said current output means to a voltage; and an operational circuit that performs an operation on said voltage selected by said selection means and a voltage developed across said conversion resistor;

wherein said current output means comprises:

a control transistor serially connected to said plurality of resistors connected in series, for controlling said current flowing through said plurality of resistors; and first to N-th transistors each controlled by a voltage identical to a voltage at a control terminal of said control transistor and each cooperating with said control transistor to form a current mirror circuit for outputting a current having a value which is proportional to a weight assigned to a corresponding one of said N less significant bits of said data for conversion, each of said first to N-th transistors being turned on and off by a corresponding one of said N less significant bits.

2. A digital-to-analog converter according to claim 1, wherein said selection means comprises a decoder that decodes said M more significant bits of said data for conversion, and a plurality of switch means each of which selects a corresponding one of voltage values at said respective junctions between said plurality of resistors, based on an output from said decoder.

3. A digital-to-analog converter according to claim 1, wherein said operational circuit has a first input to which an output from said selection means is applied, a second input to which an output from said current output means is applied, and a feedback loop into which said conversion resistor is inserted.

* * * * *